(12) United States Patent
Cai et al.

(10) Patent No.: US 10,521,299 B2
(45) Date of Patent: Dec. 31, 2019

(54) METHOD AND APPARATUS FOR DATA PROTECTION

(71) Applicant: EMC IP Holding Company LLC, Hopkinton, MA (US)

(72) Inventors: Ronnie Yu Cai, Shanghai (CN); Ao Sun, Shanghai (CN); Gary Jialei Wu, Shanghai (CN); Lu Lei, Shanghai (CN); Chen Wang, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 76 days.

(21) Appl. No.: 15/846,339

(22) Filed: Dec. 19, 2017

(65) Prior Publication Data

US 2018/0173590 A1 Jun. 21, 2018

(30) Foreign Application Priority Data

Dec. 21, 2016 (CN) .......................... 2016 1 1193307

(51) Int. Cl.
*G06F 11/00* (2006.01)
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
None
See application file for complete search history.

(56) References Cited

U.S. PATENT DOCUMENTS

| | | | | |
|---|---|---|---|---|
| 5,935,268 | A * | 8/1999 | Weaver | H03M 13/09 714/758 |
| 6,151,641 | A * | 11/2000 | Herbert | G06F 3/0607 710/22 |
| 8,904,229 | B1 | 12/2014 | Veeraswamy et al. | |
| 9,081,752 | B2 | 7/2015 | Aliev et al. | |
| 10,248,623 | B1 * | 4/2019 | Chen | G06F 16/24556 |
| 2008/0172430 | A1 * | 7/2008 | Thorstensen | G06F 3/0608 |
| 2009/0276680 | A1 * | 11/2009 | Chiu | G06F 11/1068 714/752 |

OTHER PUBLICATIONS

Ilya Usvyatsky, et al.; "Techniques for De-Duplicating Data Storage Systems Using a Segmented Index," U.S. Appl. No. 15/394,376, filed Dec. 29, 2016.

* cited by examiner

*Primary Examiner* — Daniel F. McMahon
(74) *Attorney, Agent, or Firm* — BainwoodHuang

(57) ABSTRACT

Embodiments of the present disclosure relate to method and apparatus for data protection. For example, there is provided a computer-implemented method. According to the computer-implemented method, it only needs to read the changed data to be protected rather than the entire data to be protected during the procedure of generating a redundant data portion for the changed data to be protected.

17 Claims, 5 Drawing Sheets

METHOD AND APPARATUS FOR DATA PROTECTION

RELATED APPLICATIONS

This application claim priority from Chinese Patent Application Number CN201611193307.3, filed on Dec. 21, 2016 at the State Intellectual Property Office, China, titled "METHOD AND APPARATUS FOR DATA PROTECTION" the contents of which is herein incorporated by reference in its entirety.

FIELD

Embodiments of the present disclosure generally relate to data protection, and more specifically, to a method and apparatus for data protection.

BACKGROUND

Data redundancy is used to ensure data correctness and consistency in the data storage technology. For example, Erasure Code (EC) is usually used for high efficient and durable storage. In recent years, cloud storage technology is constantly developing. For example, Elastic Cloud Storage (ECS) uses the latest trends in software architecture and development to achieve outstanding scalability, availability and performance. As the cloud storage develops, a growing number of technologies are applied into the cloud storage to achieve scalability, availability and high performance. EC can be extensively used in ESC scenario. However, when a part of the stored data changes, redoing an erasure code is resource consuming and other redundant codes also face similar problems.

SUMMARY

Embodiments of the present disclosure provide a method and an apparatus for data protection storage.

According to a first aspect of the present disclosure, there is provided a computer-implementable method, comprising: in response to determining a change in a first data segment of a first data portion, obtaining a changed first data segment and a second data portion, the first data portion including raw data to be protected and the second data portion including redundant data generated based on the raw data; generating a second data segment, bits in the second data segment indicating whether corresponding bits in the first data segment and in the changed first data segment are identical; obtaining a third data portion by expanding the second data segment, the third data portion having the same length as the first data portion; generating redundant data for the third data portion as a fourth data portion; generating a fifth data portion, bits in the fifth data portion indicating whether corresponding bits in the second data portion and in the fourth data portion are identical; updating the second data portion with the generated fifth data portion.

In some embodiments, generating the second data segment comprises: applying an exclusive-or operation to the first data segment and the changed first data segment.

In some embodiments, obtaining a third data portion by expanding the second data segment comprises: expanding the second data segment with a zero bit.

In some embodiments, generating the fifth unit comprises: applying an exclusive-or operation to the second data portion and the data portion.

In some embodiments, the second data portion is generated by performing an erasure code operation on the first data portion.

According to a second aspect of the present disclosure, there is provided an electronic apparatus. The apparatus comprises: at least one processing unit; and at least one memory coupled to the at least one processing unit and having machine executable instructions stored thereon, which, when executed by the at least one processing unit, causing the at least processing unit to be configured to: in response to determining a change in a first data segment of a first data portion, obtaining a changed first data segment and a second data portion, the first data portion including raw data to be protected and the second data portion including redundant data generated based on the raw data; generate a second data segment, bits in the second data segment indicating whether corresponding bits in the first data segment and in the changed first data segment are identical; obtaining a third data portion by expanding the second data segment, the third data portion having a same length as the first data portion; generate redundant data for the third data portion as a fourth data portion; generate a fifth data portion, bits in the fifth data portion indicating whether corresponding bits in the second data portion and in the fourth data portion are identical; update the second data portion by with the generated fifth data portion.

The Summary is provided to introduce selections of concepts in a simplified way and the concepts will be further described in the following specific embodiments. The Summary bears no intention to identify the key or main features of the present disclosure, or limit the scope of the present disclosure.

BRIEF DESCRIPTION OF THE DRAWINGS

Through the following detailed description of the example embodiments of the present disclosure with reference to the accompanying drawings, the above and other objectives, features, and advantages of example embodiments of the present disclosure will become more apparent. In example embodiments of the present disclosure, same reference signs usually represent the same components.

DETAILED DESCRIPTION OF EMBODIMENTS

Example embodiments of the present disclosure will be explained in more details with reference to the drawings. Although the drawings illustrate the example embodiments of the present disclosure, it should be appreciated that the present disclosure can be implemented in various manners and should not be limited by embodiments described herein. On the contrary, embodiments are provided for making the present disclosure more thorough and complete, and fully conveying the scope of the present disclosure to those skilled in the art.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The terms "one example embodiment" and "an example embodiment" are to be read as "at least one example embodiment." The term "a further embodiment" is to be read as "at least one further embodiment." The terms "first," "second" and so on refer to different or same objects. The following text may comprise other explicit or implicit meanings.

In the data-redundancy based data protection solution, the data after data protection operation usually includes two portions: raw data portion and redundant data portion which is generally generated based on the raw data. Thus, when data segments in the raw data portion change, it requires updating the redundant data portion, such that the updated data and the redundant data portion thereof can still provide the function of data protection.

Figure 1:
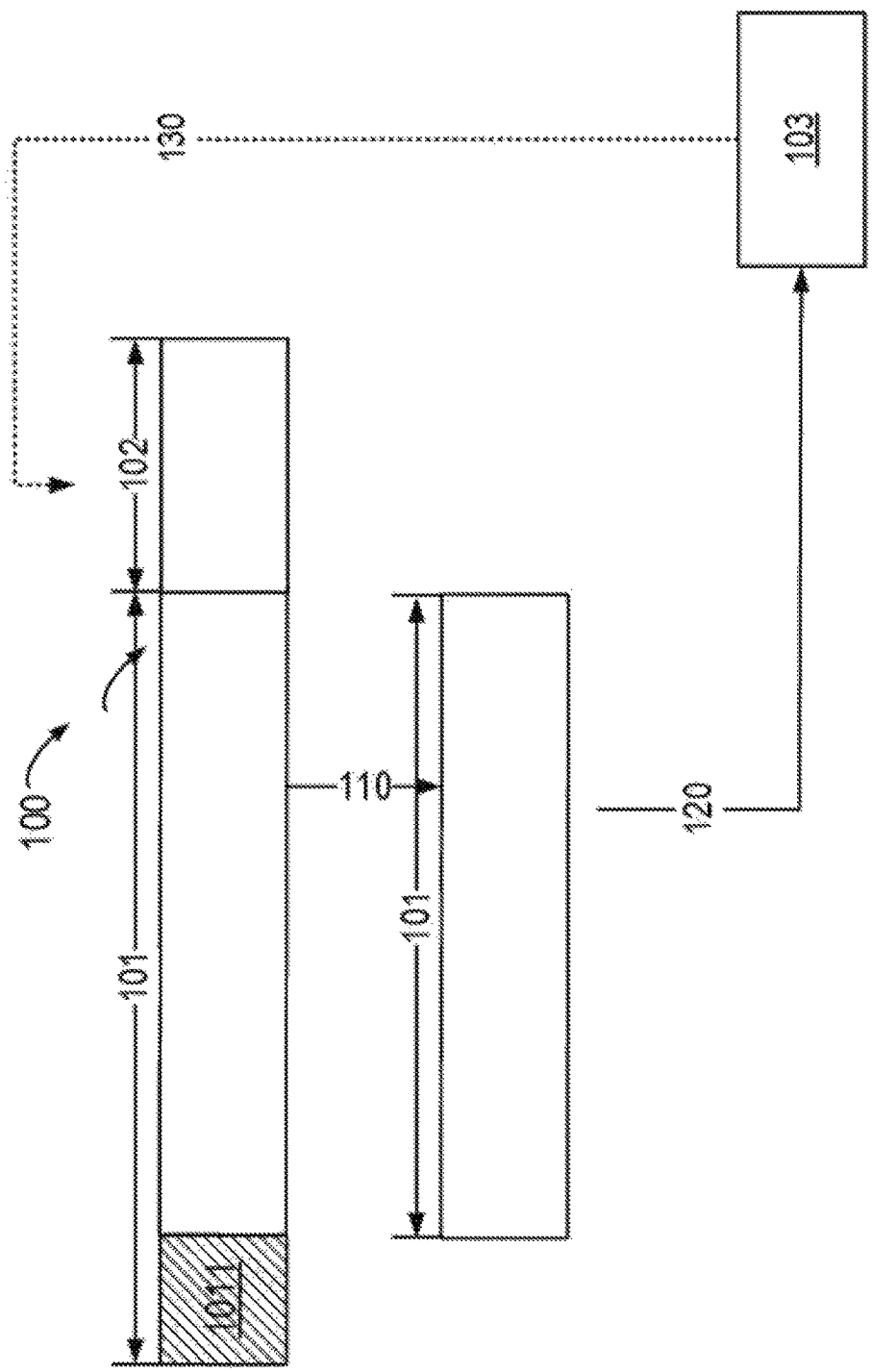
FIG. 1 shows a schematic diagram of data protection storage according to the prior art.

FIG. 1 shows a schematic diagram of a mechanism of the redundant data based protection storage. Data 100 includes two parts: raw data to be protected 101 and redundant data 102 generated based on the raw data to be protected. When a data segment 1011 in the raw data 101 changes, all data segments in the raw data 101 including the changed data segment 1011 are read (110). Afterwards, all read data segments are applied with a redundancy protection operation (120), so as to obtain a new redundant data portion 103 to replace the original redundant data portion 102.

In the above traditional procedure, I/O consumption is large. Besides, it requires storing all data segments and calculated redundant data portions while redoing EC. Therefore, memory consumption is also large. For example, assuming that the raw data portion 101 includes k data segments, the original redundant data portion has m data segments. When one data segment 1011 in the raw data portion 101 changes, it needs to read out k−1 unchanged data segments. A redundancy protection operation (120) is performed on the read k−1 raw data segments to generate a new redundant data portion 103, which includes m data segments. Then an update operation (130) is applied to the new redundant data portion 103 to update the original redundant data portion 102. This update operation (130) needs to write into m data segments of the new redundant data portion 103. The above procedure requires k−1 read operations and m write operations, so the total consumption of I/O is k−1+m.

Another traditional method is to perform an exclusive-or operation on the raw data segment and the changed new data segment to obtain an update amount, which multiplies a corresponding column of the EC matrix. The exclusive-or operation is then performed on the multiplication result in sequence with the original redundant data portion to acquire a new redundant data portion. The method needs to change the logic in the EC library, which will complicate the EC library. Apart from that, if the EC library comes from a third party, even if the source of the library is open, the method still causes maintenance issues when its own changes are not fed back or the changes are not accepted by the maintainer of the library, let alone that if the source library conducting the EC operation is closed.

Figure 2:
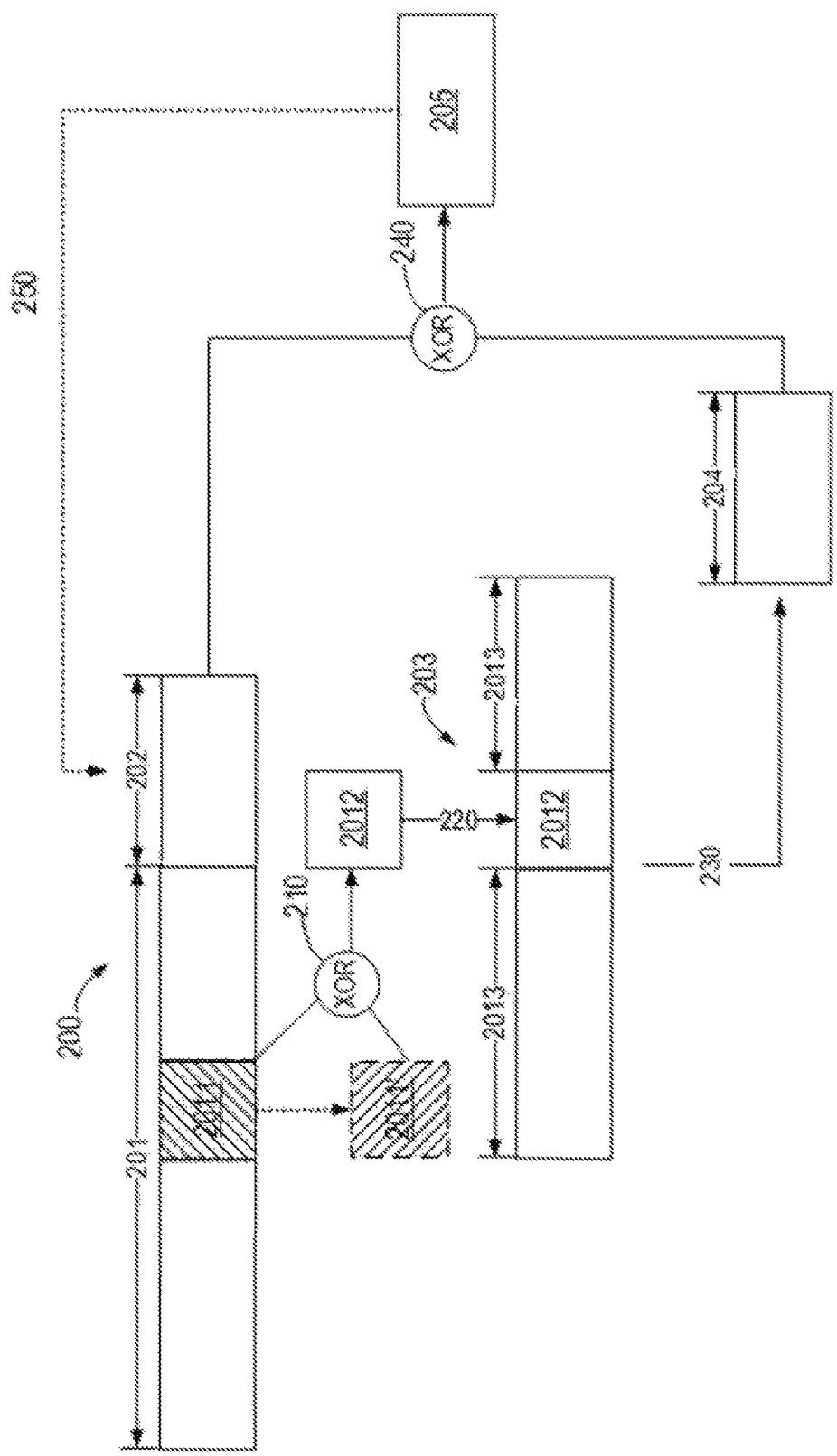
FIG. 2 shows a schematic diagram of data protection storage according to embodiments of the present disclosure.

To at least partially solve the above and other potential issues and defects, embodiments of the present disclosure provide a method for data protection storage. FIG. 2 shows a schematic diagram of data protection storage according to embodiments of the present disclosure. Data 200 includes a first data portion 201 which includes raw data to be protected and a second data portion 202 which includes redundant data generated based on the raw data. In some embodiments, the second data portion 202 can be generated by performing the EC operation on the first data portion 201.

Assuming that the data segment 2011 in the first data portion 201 changes, the changed data segment 2011' and the second data portion 202 are read out rather than the entire first data portion 201 in response to determining a change in the data segment 2011.

The second data segment 2012 is generated (210) based on the read and changed data segment 2011' and the second data portion 202. Bits in the second data segment 2012 indicate whether the corresponding bits in the first data segment 2011 and in the changed first data segment 2011' are identical or not. In some embodiments, the operation 210 can be exclusive-or (XOR) operation, which is performed on the first data segment 2011 and the changed first data segment 2011' to generate (210) a second data segment 2012. Those ordinary skilled in the art should understand that the method for generating the second data segment 2012 is not limited to performing the exclusive-or operation on the first data segment 2011 and the changed first data segment 2011'.

The second data segment 2012 is then expanded (220) to obtain a third data portion 203, such that the third data portion 203 has the same length as the first data portion 201. In FIG. 2, the data segment 2013 is an expanded data segment. In some embodiments, the data segment 2013 can be all zero bit data segment. Of course, it is also feasible to fill in other bits.

A fourth data portion 204 is generated by applying the protection operation (230) to the third data portion 203. It is to be appreciated that the fourth data portion 204 is redundant data of the third data portion 203. In some embodiments, the EC operation can be executed at 230. It is certain that any suitable technologies for generating the redundant data can also be used here and the scope of the present disclosure is not limited in this regard.

A fifth data portion 205 is generated (240) based on the second data portion 202 and the fourth data portion 204. Bits in the fifth data portion 205 indicate whether corresponding bits in the second data portion 202 and in the fourth data portion 204 are identical or not. In some embodiments, the exclusive-or operation can be performed on the second data portion 202 and the fourth data portion 204 at 240. The fifth data portion 205 is then used to update (250) the second data portion 202, for example, the second data portion 202 is replaced by the fifth data portion 205.

Figure 3:
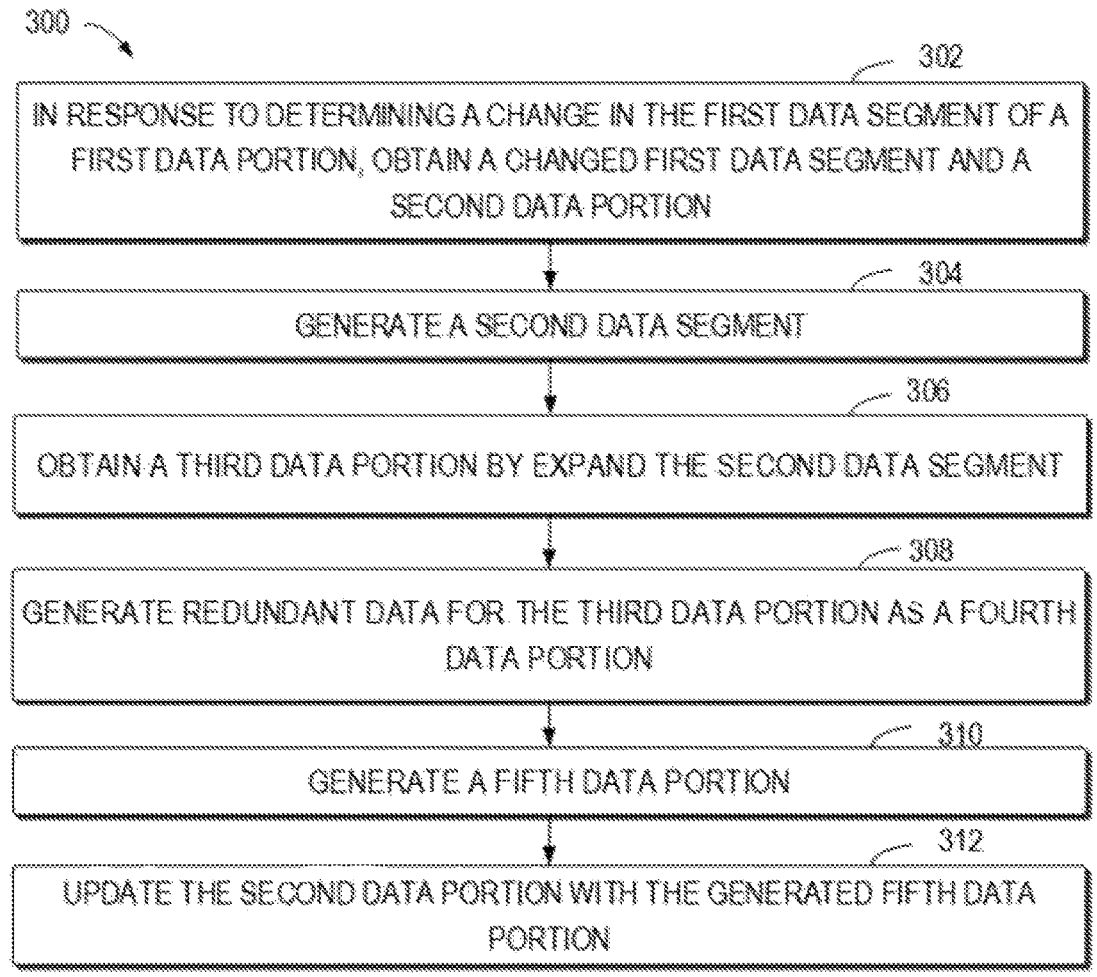
FIG. 3 shows a flow chart of a procedure or a method of data protection storage according to embodiments of the present disclosure.

FIG. 3 illustrates a flow chart of a procedure or a method 300 of data protection storage according to embodiments of the present disclosure. In some embodiments, the method 300 can be implemented in the device shown in FIG. 4. Now with reference to FIG. 2, the procedure or method 300 of data protection storage according to embodiments of the present disclosure illustrated by FIG. 3 is described.

At 302, in response to determining a change in the first data segment 2011 of the first data portion 201, the changed first data segment 2011' and the second data portion 202 are read out rather than the entire first data portion 201. The first data portion 201 includes raw data to be protected and the second data portion 202 includes redundant data generated based not the raw data. In some embodiments, the second data portion 202 is generated by performing the EC operation on the first data portion 201.

At 304, the second data segment 2012 is generated based on the read and changed data segment 2011' and the second data portion 202. Bits in the second data segment 202 indicate whether the corresponding bits in the first data segment 2011 and in the changed first data segment 2011' are identical or not. In some embodiments, the second data segment 2012 is generated by applying an exclusive-or operation to the first data segment 2011 and the changed first data segment 2011'. Those ordinary skilled in the art will understand that the method for generating the second data segment 2012 is not limited to applying an exclusive-or operation to the first data segment 2011 and the changed first data segment 2011'.

At 306, the second data segment 2012 is subsequently expanded to obtain a third data portion 203, such that the third data portion 203 has the same length as the first data portion 201. In some embodiments, the second data portion 2012 can be expanded with a zero bit. Of course, it is also feasible to fill in other bits.

At 308, a fourth data portion 204 is generated by applying the protection operation to the third data portion 203. It is to be appreciated that the fourth data portion 204 is redundant data of the third data portion 203. In some embodiments, the fourth data portion 204 can be generated by performing the EC operation on the third data portion 203. It is certain that any other suitable technologies for generating the redundant data may also be used here and the scope of the present disclosure is not limited in this regard.

At 310, a fifth data portion 205 is generated based on the second data portion 202 and the fourth data portion 204. Bits in the fifth data portion 205 indicate whether the corresponding bits in the second data portion 202 and in the fourth data portion 204 are identical or not. In some embodiments, the fifth data portion 205 can be generated by applying an exclusive-or operation to the second data portion 202 and the fourth data portion 204.

At 312, the fifth data portion 205 is then employed to update the second data portion 202, for example, the second data portion 202 is replaced by the fifth data portion 205.

Figure 4:
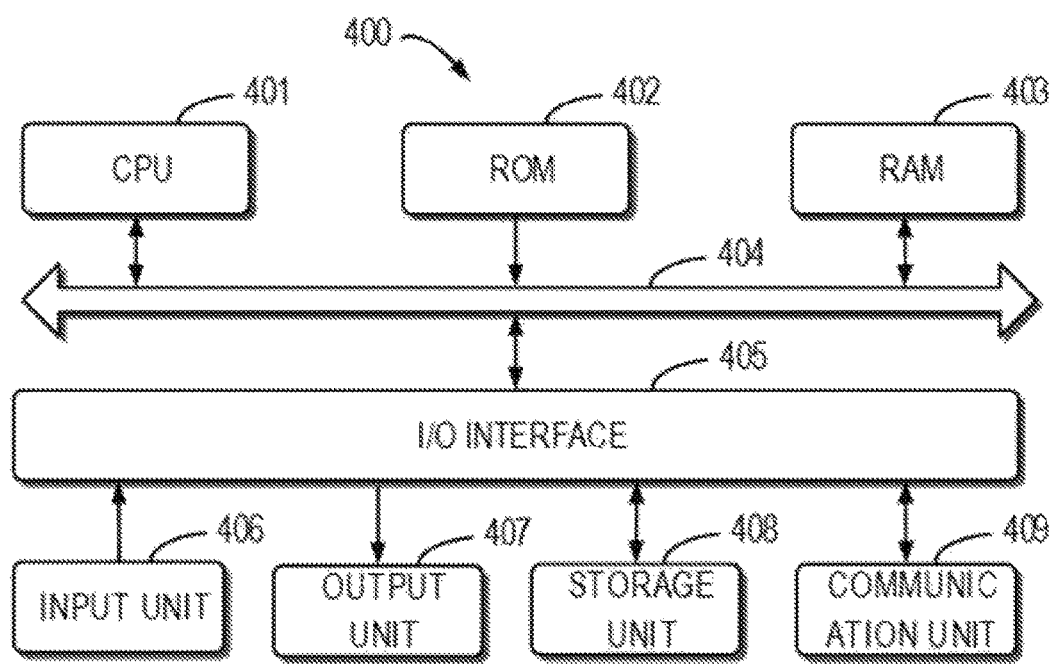
FIG. 4 shows a schematic block diagram of a device for data protection storage according to embodiments of the present disclosure.

FIG. 4 illustrates a schematic block diagram of an electronic device 400 suitable for implementing embodiments of the present disclosure. As shown, device 400 includes a central processing unit (CPU) 410, which can execute various appropriate actions and processing according to the computer program instructions stored in the read-only memory (ROM) 420 or computer program instructions loaded into the random-access memory (RAM) 430, which RAM 430 may also store a variety of programs and data desired by the operations of the apparatus 400. CPU 410, ROM 420 and RAM 430 are connected to each other via bus 440. Input/output (I/O) interface 450 is also connected to the bus 440.

A plurality of components in device 400 is connected to the I/O interface 450 which includes: an input unit 460, for example, a keyboard, a mouse and so on; an output unit 470, such as all kinds of displays, loudspeakers and the like; a storage unit 480, for example, a disk, an optical disk and the like; and a communication unit 490, such as a network card, modem, a wireless transceiver and so on. The communication unit 490 allows the device to exchange information/data with other devices via computer networks, such as Internet, and/or various telecommunication networks.

The above described every procedure and processing, for example, method 300, can be executed by the processing unit 410. For instance, in some embodiments, the method 300 can be implemented as a computer software program, which is tangibly included in the machine readable medium, for example, storage unit 480. In some embodiments, the computer programs are partially or fully loaded into and/or mounted to the device 400 via ROM 420 and/or communication unit 490. When the computer program is loaded into the RAM 430 and executed by the CPU 410, it can perform one or more steps of the above described method 300. Alternatively, in other embodiments, CPU 410 can also be configured to realize the above procedure by any suitable methods.

Figure 5:
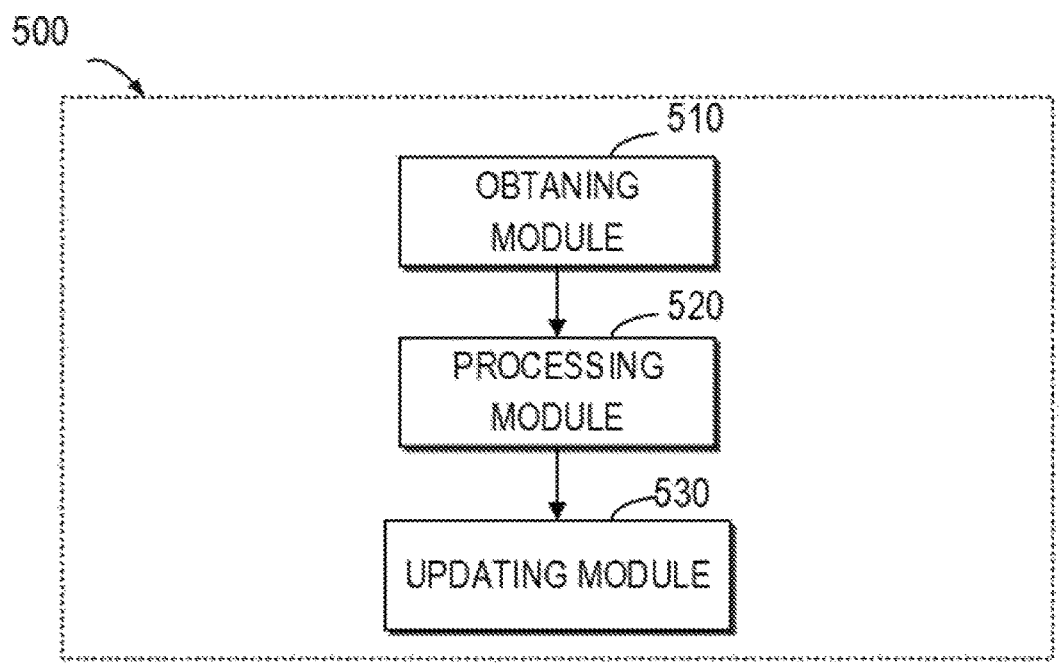
FIG. 5 shows a schematic block diagram of an apparatus for data protection according to embodiments of the present disclosure.

FIG. 5 illustrates a schematic block diagram of an apparatus for data protection according to embodiments of the present disclosure. As shown, the apparatus 500 includes an obtaining module 510, a processing module 520 and an updating module 530.

The obtaining module 510 is configured to obtain a changed first data segment and a second data portion in response to determining a change in a first data segment of the first data portion, where the first data portion includes raw data to be protected and the second data portion includes redundant data generated based on the raw data.

The processing module 520 is configured to generate a second data segment, in which bits indicate whether corresponding bits in the first data segment and in the changed first data segment are identical or not; obtain a third data portion by expanding the second data segment, where the third data portion has the same length as the first data portion; generate redundant data for the third data portion as a fourth data portion; generate a fifth data portion, in which bits indicates whether corresponding bits in the second data portion and in the fourth data portion are identical or not. In some embodiments, the processing module 520 is also configured to apply an exclusive-or operation to the first data segment and the changed first data segment. In some embodiments, the processing module 520 is further configured to expand the second data segment with a zero bit. In some embodiments, the processing module 520 is configured to perform an exclusive-or operation on the second data portion and the fourth data portion.

The updating module 530 is configured to update the second data portion using the generated fifth data portion.

Modules included in the apparatus 500 can be implemented by various manners, including software, hardware, firmware or any combinations thereof. In one embodiment, one or more modules can be implemented by software and/or firmware, for example, machine executable instructions stored on the storage medium. Apart from the machine executable instructions or as an alternative, some or all of the modules in the apparatus 500 can be at least partially implemented by one or more hardware logic components. As an example rather than a limitation, example types of available hardware logic components include field programmable gate array (FPGA), application-specific integrated circuit (ASIC), application-specific standard product (ASSP), system on chip (SOC), complex programmable logic device (CPLD) and so on.

Embodiments of the present disclosure may be applied in different environments. As a non-limited example, embodiments of the present disclosure can be applied into disk capacity management, which barely relies on a file system. In the disk capacity management, all disks are divided into a set of blocks having fixed length and known as "data chunks." All user data is stored in the data chunks and the chunks are shared. One data chunk can include segments consisting of a plurality of user objects and the data chunk has storage overhead after the EC operation and can provide higher data durability. When some objects are deleted, a part of the data chunk turns into garbage and the corresponding space should be returned for reuse. Besides, when the garbage is freed, it requires re-operating EC to appropriately protect the data. The operation procedure using the traditional method will be quite slow because of the demand for I/O and memory, which delays the garbage free and makes reuse of the disk space impossible in a short time when the user has deleted the objects. The application of the embodiments according to the present disclosure can expedite garbage free to a large extent. As a further non-restrictive example, embodiments of the present disclosure may be applied into secondary back-up of storage data in a remote area. To save WAN traffic data shipped between areas, the exclusive-or operation is required between the shipped data and the existing data chunks. The application of the embodiments according to the present disclosure can save consumption.

Compared with the prior art, embodiments of the present disclosure has various advantages, for example, embodiments of the present disclosure do not need to complicate the EC library or pay the maintenance costs. Embodiments of the present disclosure can also save the use of disk I/O and memory.

By means of the teaching offered in the above description and drawings, many modifications of the present disclosure presented herein and other implementations will be realized by those skilled in the art. Therefore, it should be understood that implementations of the present disclosure are not limited to the specific implementations of the present disclosure and modifications and other implementations are also included in the scope of the present disclosure. Furthermore, although the above description and related drawings explain the example implementations in the context of a given example combination of the component and/or function, it should be understood that the alternative implementation can provide a different combination of the component and/or function without deviating from the scope of the present disclosure. At this point, other combinations of components and/or functions being a bit different from the above description are expected to be within the scope of the present disclosure. Although specific terms are used herein, they only represent the general and descriptive meanings and bear no intention to limit the scope.

We claim:

1. A computer-implemented method, comprising:
   in response to determining a change in a first data segment of a first data portion, obtaining a changed first data segment and a second data portion, the first data portion including raw data to be protected, and the second data portion including redundant data generated based on the raw data;
   generating a second data segment, bits in the second data segment indicating whether corresponding bits in the first data segment and in the changed first data segment are identical;
   obtaining a third data portion by expanding the second data segment, the third data portion having a same length as the first data portion;
   generating redundant data for the third data portion as a fourth data portion;
   generating a fifth data portion, bits in the fifth data portion indicating whether corresponding bits in the second data portion and in the fourth data portion are identical;
   updating the second data portion with the generated fifth data portion.

2. The method of claim 1, wherein generating the second data segment comprises:
   applying an exclusive-or operation to the first data segment and the changed first data segment.

3. The method of claim 1, wherein obtaining a third data portion by expanding the second data segment comprises:
   expanding the second data segment with a zero bit.

4. The method of claim 1, wherein generating the fifth data portion comprises:
   applying an exclusive-or operation to the second data portion and the fourth data portion.

5. The method of claim 1, wherein the second data portion is generated by performing an erasure code operation on the first data portion.

6. An electronic apparatus, comprising:
   at least one processing unit; and
   at least one memory coupled to the at least one processing unit and having machine executable instructions stored thereon which, when executed by the at least one processing unit, causing the electronic apparatus to perform acts including:
   in response to determining a change in a first data segment of a first data portion, obtaining a changed first data segment and a second data portion, the first data portion including raw data to be protected, and the second data portion including redundant data generated based on the raw data;
   generating a second data segment, bits in the second data segment indicating whether corresponding bits in the first data segment and in the changed first data segment are identical;
   obtaining a third data portion by expanding the second data segment, the third data portion having a same length as the first data portion;
   generating redundant data for the third data portion as a fourth data portion;
   generating a fifth data portion, bits in the fifth data portion indicating whether corresponding bits in the second data portion and in the fourth data portion are identical;
   updating the second data portion with the generated fifth data portion.

7. The apparatus of claim 6, wherein generating the second data segment comprises:
   applying an exclusive-or operation to the first data segment and the changed first data segment.

8. The apparatus of claim 6, wherein obtaining a third data portion by expanding the second data segment comprises:
   expanding the second data segment with a zero bit.

9. The apparatus of claim 1, wherein generating the fifth data portion comprises:
   applying an exclusive-or operation to the second data portion and the fourth data portion.

10. The apparatus of claim 1, wherein the second data portion is generated by performing an erasure code operation on the first data portion.

11. A computer program product tangibly stored in a non-transient computer readable medium and including machine executable instructions which, when executed, cause a machine to perform the method according to claim 1.

12. The computer program product of claim 11, wherein the machine executable instructions, when executed, cause the machine to perform the method according to claim 2.

13. The computer program product of claim 11, wherein the machine executable instructions, when executed, cause the machine to perform the method according to claim 3.

14. The computer program product of claim 11, wherein the machine executable instructions, when executed, cause the machine to perform the method according to claim 4.

15. The computer program product of claim 11, wherein the machine executable instructions, when executed, cause the machine to perform the method according to claim 5.

16. The method of claim 1, wherein the first data segment is a first subset of the first data portion, the second data segment is a second subset of the third data portion, and the second data segment is surrounded by zero bits within the third data portion.

17. The method of claim 16, wherein the first data segment and the second data segment occupy a same relative position within the respective first and third data portions.

* * * * *